United States Patent
Gillis

(10) Patent No.: US 7,035,784 B1
(45) Date of Patent: Apr. 25, 2006

(54) DATA-DRIVEN METHOD SIMULATOR AND SIMULATION PROCESS

(75) Inventor: Philip William Gillis, Whippany, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 751 days.

(21) Appl. No.: 09/667,709

(22) Filed: Sep. 22, 2000

(51) Int. Cl.
*G06F 17/50* (2006.01)
*G06G 7/62* (2006.01)

(52) U.S. Cl. ............... 703/17; 703/1; 703/2; 703/6; 703/15; 703/16; 715/507; 375/340; 714/38; 712/200

(58) Field of Classification Search ............... 703/21, 703/13, 24, 1, 2, 6, 15–17; 371/22, 25, 19; 712/200; 715/507; 375/340; 714/38
See application file for complete search history.

(56) References Cited

U.S. PATENT DOCUMENTS

| | | | | |
|---|---|---|---|---|
| 4,527,249 A | * | 7/1985 | Van Brunt ............ | 703/15 |
| 4,791,593 A | * | 12/1988 | Hennion ............... | 703/14 |
| 5,121,475 A | * | 6/1992 | Child et al. .......... | 715/507 |
| 5,440,726 A | * | 8/1995 | Fuchs et al. .......... | 714/20 |
| 5,475,832 A | * | 12/1995 | Shoji et al. ........... | 703/15 |
| 5,515,382 A | * | 5/1996 | Lassorie ............... | 714/730 |
| 5,563,959 A | * | 10/1996 | Gallo et al. .......... | 382/187 |
| 5,613,062 A | * | 3/1997 | Hasebe et al. ........ | 714/37 |
| 5,781,720 A | * | 7/1998 | Parker et al. ......... | 714/38 |
| 6,405,365 B1 | * | 6/2002 | Lee ...................... | 717/106 |
| 6,549,881 B1 | * | 4/2003 | Dearth et al. ........ | 703/21 |
| 6,888,900 B1 | * | 5/2005 | Starr et al. ........... | 375/340 |

OTHER PUBLICATIONS

Microsoft Computers Dictionary (1997, Microsoft Corparation, 3rd Edition).*

* cited by examiner

*Primary Examiner*—Anthony Knight
*Assistant Examiner*—Sunray Chang

(57) ABSTRACT

A simulator and/or simulation process operates by receiving a message from a system; comparing the received message to information stored in a response file used to simulate system response; and simulating a response to the system by outputting a response stored in association with a stored message matching the received message. The response file includes at least one message, a message marker associated with each message, at least one response associated with each message, and an end-of-response marker associated with each response. At least two responses are stored in association with a message, and the at least two responses are sequentially output in response to sequential receipt of the message. As such, the simulator can reply to any message by looking up its associated response in the response file. If more than one associated response appears in the response file, receipt of identical messages will illicit sequential and differing responses. Thereby, an effective simulator and/or simulation process can easily and simply be developed to thereby enable development of various components of a system in an environment independent of other components of the system.

30 Claims, 10 Drawing Sheets

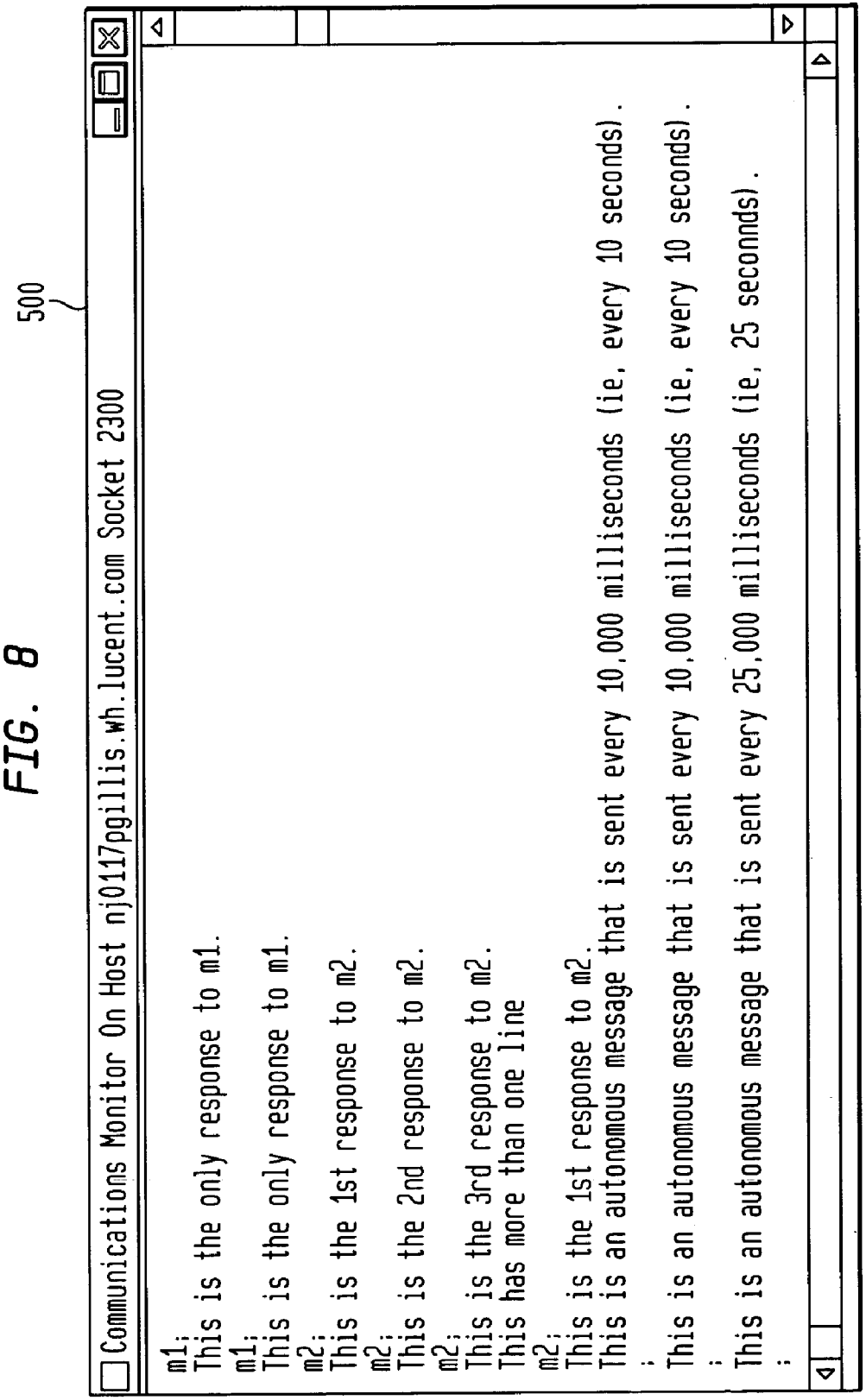

DATA-DRIVEN METHOD SIMULATOR AND SIMULATION PROCESS

BACKGROUND OF THE INVENTION

1. Field of the Invention

The field of the invention is generally directed to message simulators and simulation processors.

2. Background of the Invention

Many systems must be developed to interact with other systems. In developing a first system, one needs to understand how this first system will interact with other second systems. As shown in prior art FIG. 1, a first system 10 will have to send commands/requests to a second system 20, which will send responses back to the first system 10. However, these other systems may also be under development and thus cannot be used in developing the first system. For example, someone may be developing a first system such as a graphical user interface, which will interact with other systems of an overall telecommunication system, for example. For certain messages sent by the first graphical user interface system, one must know how a second system of the overall telecommunication system will react, and what responses will be received therefrom.

A first problem that arises is that although the two systems must interact together, different people may be working on the two different systems, which are both under development. Further, although one must understand how the first system interacts with other systems in order to properly develop it, the other system may not have been built and similar interaction problems may exist which inhibit its development.

In the past, these problems were solved by building simulators, wherein the simulator was able to simulate expected responses received from the first system. However, it was often difficult to build effective simulators. Further, the cost to build these simulators was very high and took a long time to develop. This tended to make development and testing of the first system much harder and had a negative impact on development time and cost. Thus, a need exists for developing a simple way to test various aspects of interactive system components under development.

SUMMARY OF THE INVENTION

The present invention is directed to solving the aforementioned problem by creating a simple simulator and/or simulation process. The process operates by receiving a message from a system; comparing the received message to information stored in a response file used to simulate system response; and simulating a response to the system by outputting a response stored in association with a stored message matching the received message. The response file includes at least one message, a message marker associated with each message, at least one response associated with each message, and an end-of-response marker associated with each response. Further, when at least two responses are stored in association with a message, the at least two responses are sequentially output in response to sequential receipt of the message.

As such, a generic simulator is developed that can reply to any message by looking up its associated response in a file, called the response file. When the simulator receives a message, it looks up the message in the file and outputs its associated response. If more than one response appears in the response file, receipt of identical messages will elicit sequential and differing responses. Thereby, an effective simulator and/or simulation process can easily and simply be developed to thereby enable development of various components of the system in an environment independent of other components of the system.

BRIEF DESCRIPTION OF THE DRAWINGS

The present invention will become more fully understood from the detailed description given hereinbelow in the accompanying drawings which are given by way of illustration only, and thus are not limitative of the present invention, wherein like reference numerals represent like elements, and wherein;

FIG. 8 is an exemplary screen shot indicating messages and responses in an example illustration of a use of the simple simulator of the present application.

DETAILED DESCRIPTION

The present application is directed to a simulator and simulation process enabling, among other things, the building and testing of one aspect or component of a system without the need to await full development of other aspects or components of the system which may be under development. The simulator and simulation process receive messages from a system and generate multiple responses, which may be the same or which may be different, to thereby simulate actual operation of a second system which may need to interact with the first system. Received messages are compared to information stored in a response file, which is used to simulate system response. The response file includes at least one message, a message marker associated with each message, at least one response associated with each message, and an end-of-response marker associated with each response. A response is simulated by outputting a response stored in association with a stored message matching a received message, upon a match being determined. If there are at least two responses stored in association with the message, the at least two responses are sequentially output in response to sequentially receiving the message. Thus, this simulation system and process do not merely output the same response upon receipt of a message, but may output multiple differing responses in the sequential manner, if so programmed. This allows the system to operate as a true simulation of a second system, which may produce different responses in response to the receipt of the same message. As such, flexibility in the simulator is achieved.

Figure 1:
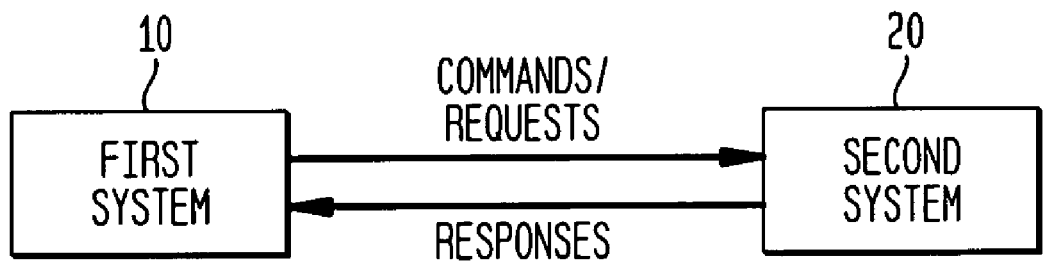
FIG. 1 is a prior art diagram of a first system operating in conjunction with the second system.
Figure 2:
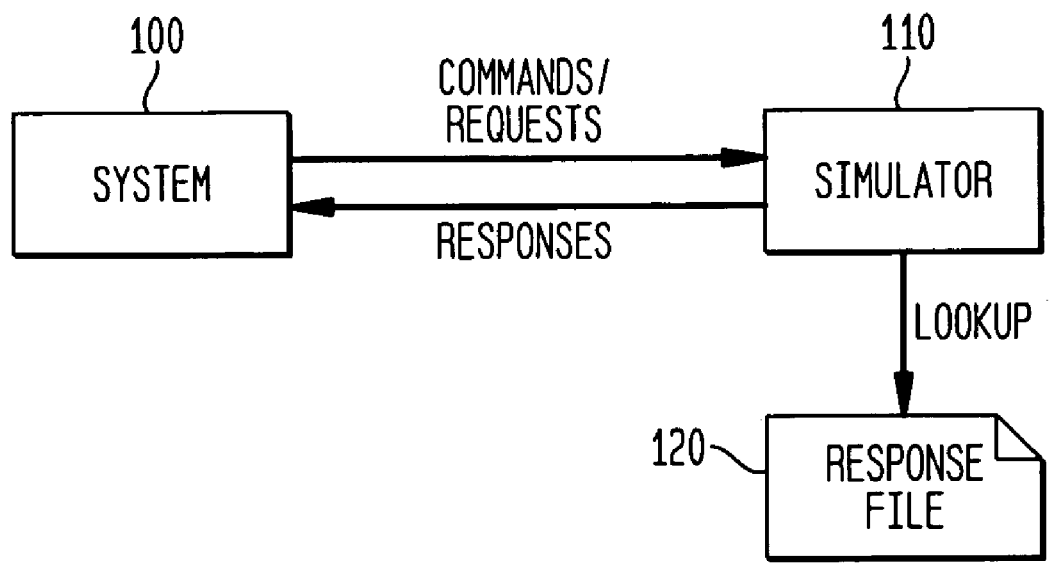
FIG. 2 is a diagram of a first system operating in conjunction with a simulator of the present invention.

FIG. 2 is an illustration of the simple simulator 110 of the present application simulating a second system for interaction with the first system 100. Such a simulator 110 may be used, for example, during the development of the first system 100. As such, during development of the first system 100, commands and requests can be generated and sent to the simulator 110, wherein the simulator 110 then looks up responses in a response file 120 and sends those responses back to system 100, thereby simulating operation of the second system.

The simulator 110 may be distributed as a self-contained executable file, which need not be examined or changed. The behavior of the simulator 110 is determined by response files 120, which the user may modify or provide. These may be plain text files, created by any standard text editor, for example. Thus, a designer of system 100 can specify simulator behavior of simulator 110 by simply editing files containing messages (which he is already familiar with), without involving any programming language, wherein these messages and responses can be stored in response files 120 which can be looked-up by the simulator 110. Alternatively, the response files 120 can be created in other ways, such as by utilizing existing log files of the system 110, for example.

By creating a response file 120, a user can simulate different sequential responses to receipt of the same message. The ability to respond to the same message in sequence with multiple responses adds greatly to the value of simulator 110, since it allows the simulator 110 to realistically act as another system for greater sequences of messages. Thus, the simulator 110 may or may not respond the same way each time a message is received, and does not require programming logic to respond with different responses. Instead, it operates off a program which is simple, and which can be written in a variety of programming languages such as Visual Basic, Java, C, and C++ for example.

The simulator 110 does not care about message format, but only that there are identifiable messages of some kind and identifiable associated responses stored in the response file 120. As will be explained hereinafter, the simulator 110 recognizes a designated message marker used to identify a message; an end of message marker; and an end-of-response marker, wherein these markers are similarly used when creating the response file 120. Thereby, simulator 110 can identify received messages and appropriate responses can be obtained from response file 120. The simulator can be used for many formats including, but not limited to, the standard TL1 telephone message format, Cisco IOS, or any other command/response format. In addition, the response file 120 can include messages which are autonomously generated at specified times or over specified periodic intervals, which will be explained in more detail with respect to other aspects of the present application.

Figure 3A:
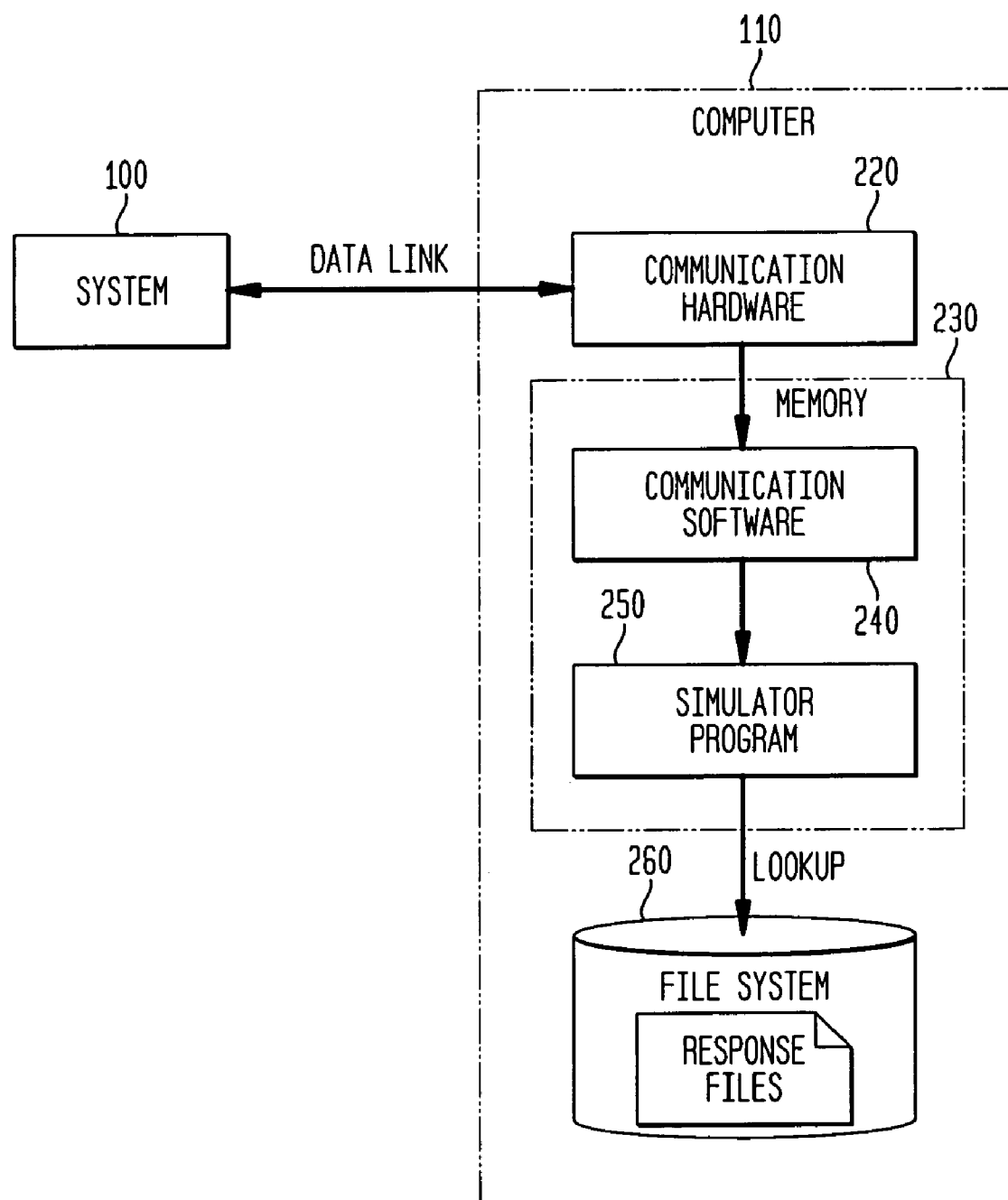
FIG. 3a is a diagram illustrating the hardware details of the simulator of FIG. 2.

FIG. 3a illustrates one aspect of the hardware and software of the simple simulator of the present application. The system 100 can be linked to the simulator 110 via any type of data link such as a cable, wireless data link, optical data link, etc., with the simulator 110 housed within a computer such as a personal computer, for example. As such, the computer includes standard communication hardware 220 including, for example, an interface, input device, display, CPU, and memory elements such as random access memory (RAM) and read-only memory (ROM). Thus, the computer of the simulator 110 can interact with the system 100 under design, so as to receive commands or requests from the system 100 and provide or output responses thereto.

The communication hardware 220 interfaces with the elements stored in memory 230, within the simulator 110. These include standard communication software elements 240 which enable the simulator 110 to communicate with another system such as system 100; as well as the simulator program 250, which allows a computer to operate as a simulator 110. The methodology of the simulator program 250 will be described hereafter with regard to FIG. 3b.

Figure 3B:
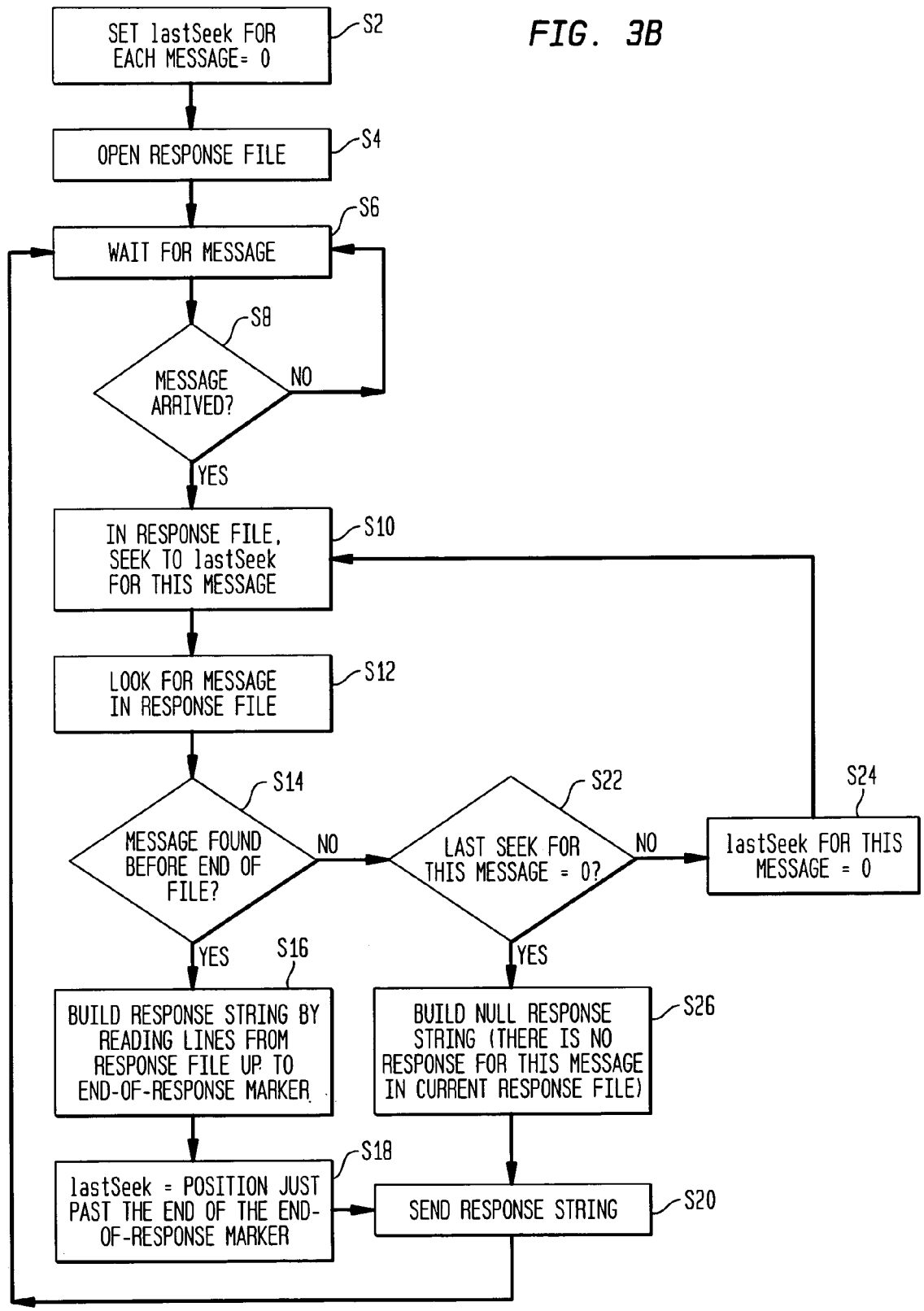
FIG. 3b is a flowchart illustrating the simulation methodology that the simulator of FIG. 2 executes.

FIG. 3b illustrates the methodology of the program 250 that the simulator 110 of the present application executes. Initially, in Step S2, the system sets "last seek" for each message to 0 to thereby initialize the system. "Last seek" is an exemplary variable associated with each distinct message, which indicates where to start looking for the next response for that message. It is equal to the number of bytes from the beginning of the response file 120, and indicates where to start looking for the next response for a given message.

After Step S2, the system proceeds to Step S4, wherein the response file 120 is opened. Thereafter, in Step S6, the system waits for a message. In Step S8, it is determined whether or not a message has arrived. If not, the system returns to Step S6 to wait for a message. If a message has arrived, the system proceeds to Step S10.

In Step S10, the system finds the variable "last seek" for the received message, and "seeks" to the byte location stored in the variable "last seek". "Seeks", in this context, is a technical term commonly used in programming interactions with a file system, and refers to setting the number of bytes from the beginning of a file where the next read (or write) operation will commence. In this example, only the read operation is used. The number of bytes is called the "byte location". Remembering this stored "last seek" location and "seeking" to it as successive identical messages are received, is one exemplary mechanism for allowing the simulator 110 to respond, to successively received identical messages, with different responses.

Thereafter, in Step S12, the system checks the response file for the received message. In Step S14, it is determined whether or not the message has been found in the response file before the "end" of a file is reached.

If the message has been found in response file 120 of the simulator 110 in Step S14, the system proceeds to Step S16. In Step S16, a response string is built by reading lines from the response file up to a designated end-of-response marker. Thereafter, in Step S18, "last seek" is set to equal a position just past the end of the designated end-of-response marker. In Step S20, the response string corresponding to the received message is then sent and the system proceeds back to Step S6 to wait for a new message.

If the message is not found before the end of the response file in Step S14, the system proceeds to Step S22, wherein it determines whether or not "last seek" for the received message equals 0. If not, the "last seek" for this message is set to 0 in Step S24, and the system proceeds back to Step S10, wherein the system "seeks" to the byte location stored in "last seek" for the received message. If "last seek" for the message is 0 as determined in Step S22, the system proceeds to Step S26.

In Step S26, a "no response" string is built, indicating that there is no response for this message in the current response file. Thereafter, this "no response" string is sent by the simulator 110 in Step S20 and the system proceeds back to Step S6 to wait for a new message.

Thus, the simulator program 250 allows the simulation to interact with the communication software 240 and communication hardware 220 so that the computer operates as simulator 110. Further it interacts with response files 120 stored in a database 260, for example. The response files 120 will be discussed in more detail hereafter, but basically include text files including message/response pairs and message/response markers. A message appears on one line, followed by its response, which may span multiple lines and which is typically terminated by a specified end-of-response marker. When a message is received by the simulator 110, it looks up the message in response file 120 and outputs its associated response. If more than one associated response appears in the response file 120, successively received identical messages will illicit successive associated responses. For example, for messages received for the second time by simulator 110, the second response associated with the message is output. If there are no more responses, the search will begin from the beginning of the file, thus repeating the sequence and the first response will be output by simulator 110 again. This allows the simulator 110 to respond with different responses to the same messages, to provide a much improved simulation over simple static responses.

Response files may be written by hand, or are even preferably generated by logging message traffic between systems. That is, a response file can actually look identical to a log file. This is a useful way of capturing the behavior of an existing system for some sub-set of its message interface. As such, the simulator 110 may be used in place of another sub-system or component of the system, in situations such as when the component or sub-system is under development and/or being shared by other systems.

Figure 3C:
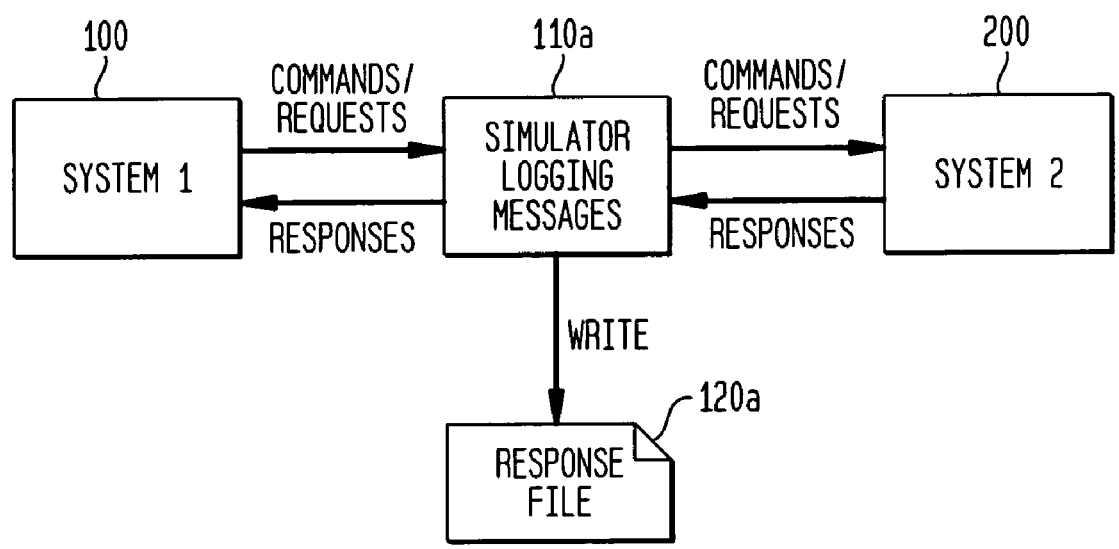
FIG. 3c is a diagram illustrating the simulator utilizing logged messages.

FIG. 3c illustrates an aspect of the present application wherein the simulator generates a response file by logging message traffic between two systems. FIG. 3c illustrates first system 100, and a second system 200, with a simulator 110a logging messages therebetween. The first system 100 (system 1) sends commands and requests which are received by simulator 110a. These commands and requests are then passed on to a second system 200 (system 2). The second system 200 then prepares its responses which are received first by simulator 110a. The simulator 110a logs these responses to create a response file 120. The responses are then passed on to the first system 100. By the simulator 110a logging responses from system 2 in response to commands or requests sent by system 1, it creates a response file 120a including both messages (commands/requests from the first system 100) and responses corresponding thereto (from the second system 200). This "log file" can then be used as a response file 120a when simulator 110a is connected to a different first system 100.

Simulator 110a in the configuration of FIG. 3c is established by the user setting the simulator to a "pass through" mode by means of a command button, for example, wherein it bypasses its normal situation mode and instead, simply passes all messages through in either direction; and when doing so, records each message by appending it to its selected response file 120a. Recording "conversations" like this is "logging", and the output response file is a "log file" in this context. Thus, the "log file" can be used as a "response file" in connection with the present application.

In addition, the response file 120 may store messages which are initiated on their own, at specified times. These autonomous responses can be output by simulator 1110 at predetermined times after simulation begins, for example, irrespective of a received message. A special message called a "timer XX" may be provided, wherein the "XX" may specify the time in units, for example in seconds. When the simulator 110 initializes, it sends itself a "timer XX" message, which then outputs its response at the specified time, such as 20 seconds after simulation begins, for example. Repeat messages may be handled by the syntax: "timer XX R", to thereby allow for periodic output of autonomous messages, such as every 10 seconds for example.

Figure 4A:
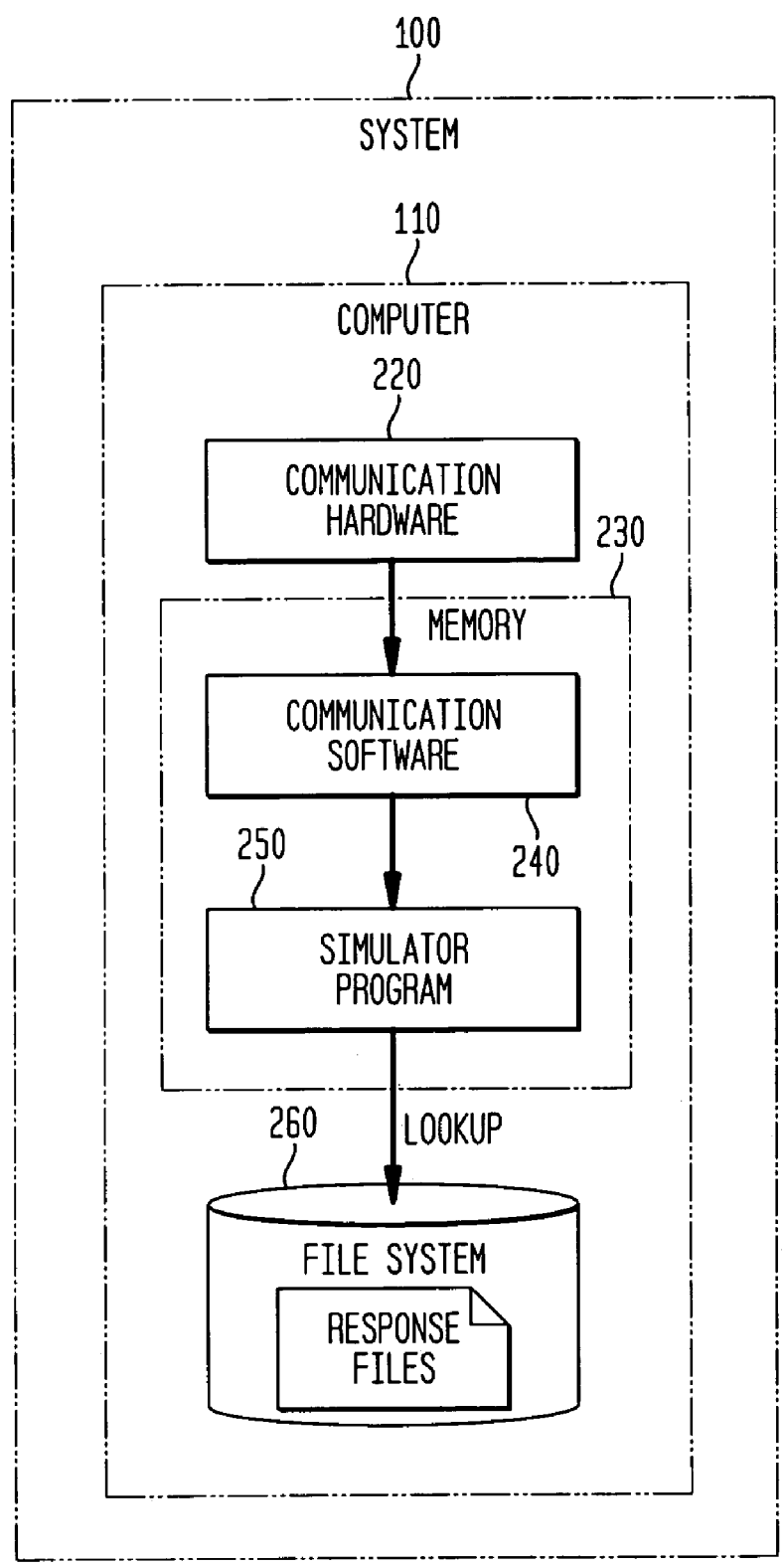
FIG. 4a is a diagram of an alternate embodiment of the present application wherein the simulation occurs within the hardware and software of the first system itself.

FIG. 4a illustrates another embodiment of the present application. In this embodiment, the computer elements of the system 100 itself are used to act as the simulator 110. In other words, the simulator 110, since it may only require computer hardware already present in the first system 100 and various software elements including the simulator program 250 and the response file 260, the first system 100 need not be linked to a second physical computer, but need only be internally linked so as to interact with a simulator 110 utilizing the system 100 operating components. Thus, FIG. 4a is included to clarify that the simulator 110 of the present application need not only be included in a separate computer, but could be included on a computer within a system 100 itself wherein other components of the system 100 itself interact with the simulator program 250 and response file 260 in a manner similar to that previously described with regard to FIG. 3a.

Figure 4B:
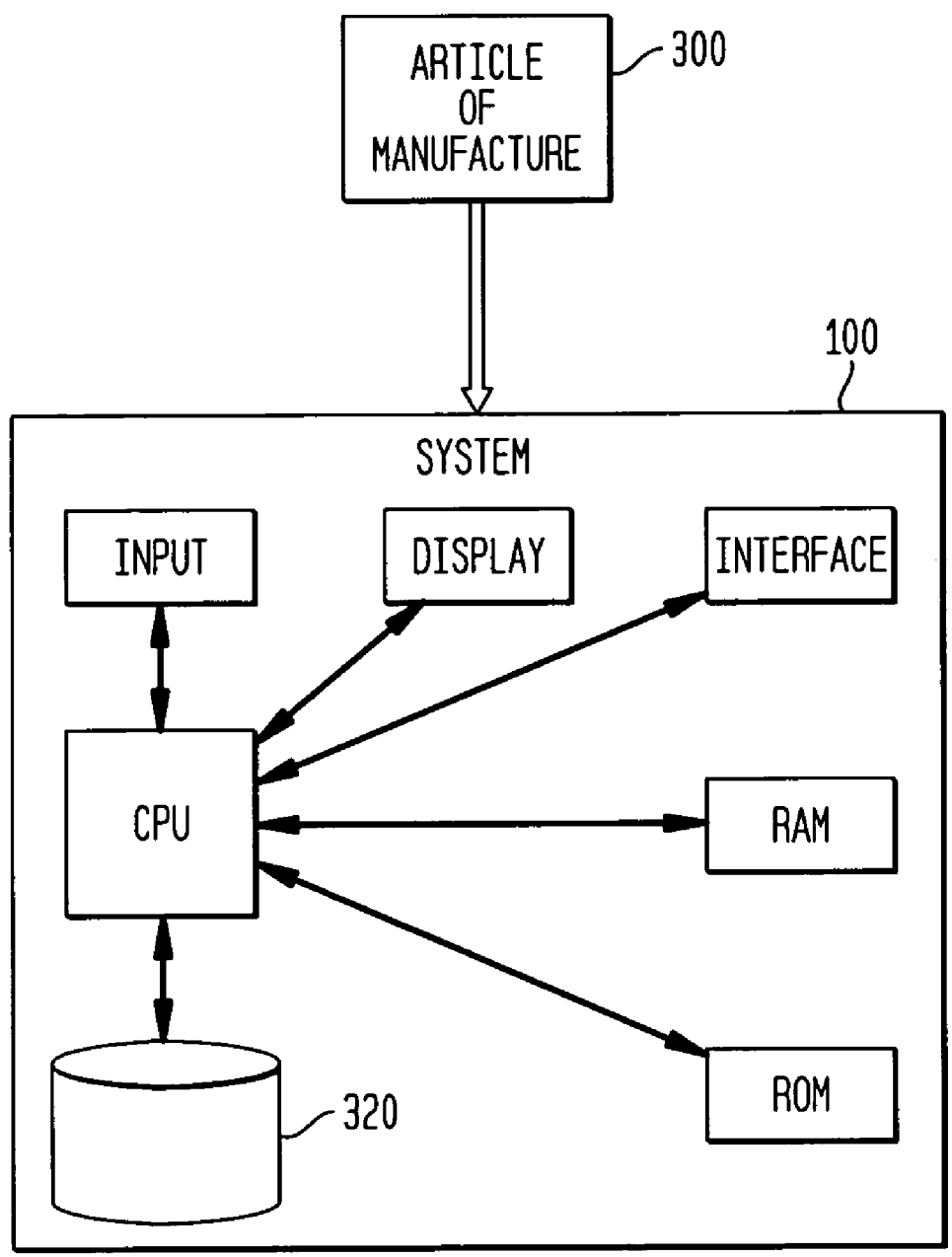
FIG. 4b is an alternate embodiment of the present application directed to an article of manufacture.

Finally, FIG. 4b illustrates another embodiment of the present application wherein the simulator program 250 and/or response file 120 are housed within a single article of manufacture 300 itself. The article of manufacture 300 can include any type of storage element which can be associated and used in conjunction with the system 100 (or with a separate system 110), including but not limited to a floppy disc, zip drive, memory chip, compact disc, optical disc, magneto-optic disc, etc. The article of manufacture 300 includes a first computer readable code segment for causing the computer of system 100 to compare a message received from a system to information stored in a response file used to simulate system response. The response file 120, also included within an article of manufacture 300, or stored in a separate memory such as database 320 associated with system 100 for example, includes at least one message, a message marker associated with each message, at least one response associated with each message, and an end-of-response marker associated with each response.

The article of manufacture 300 further preferably includes a second computer readable code segment for causing the computer system 100 to simulate a response to the received system message by outputting a response stored in association with a stored message matching the received message, upon a received message matching a message stored in the response file 120. When at least two responses are stored in association with the message, and the at least two responses are sequentially output in response to sequential receipt of the message.

The article of manufacture 300 can be used in conjunction with either of the embodiments shown in FIGS. 3a and 4a, namely it can be for use in conjunction with a computer of the system 100 itself such as that shown in FIG. 4a; or can be for use in conjunction with a computer separate from, but operatively connected to the system, such as that shown in FIG. 3a. The article of manufacture 300 can include the response file 120, or the response file 120 can be stored in another memory such as database 320 of the system 100, for example. The response file 120 can include at least one autonomous response, and if so, the second computer readable code segment causes the computer to output the autonomous response at a predetermined time after simulation begins, irrespective of a received message. Finally, the response file 120 can include at least two different messages, each associated with at least one response.

In another preferred embodiment, the article of manufacture 300 preferably includes a third computer readable code segment causing the computer to store a record of a received message, wherein upon a message being received a second time, either a second response stored in association with the received message is output, or the first response is again output if no second response is stored in association with the received message. Sequential responses stored in the response file 120 in association with a common message are sequentially output upon successive receipt of the common message. Additionally, similar to the embodiments of FIGS. 3a and 4a, the response file 120 may be created using a log file of the system 100.

Figure 5:
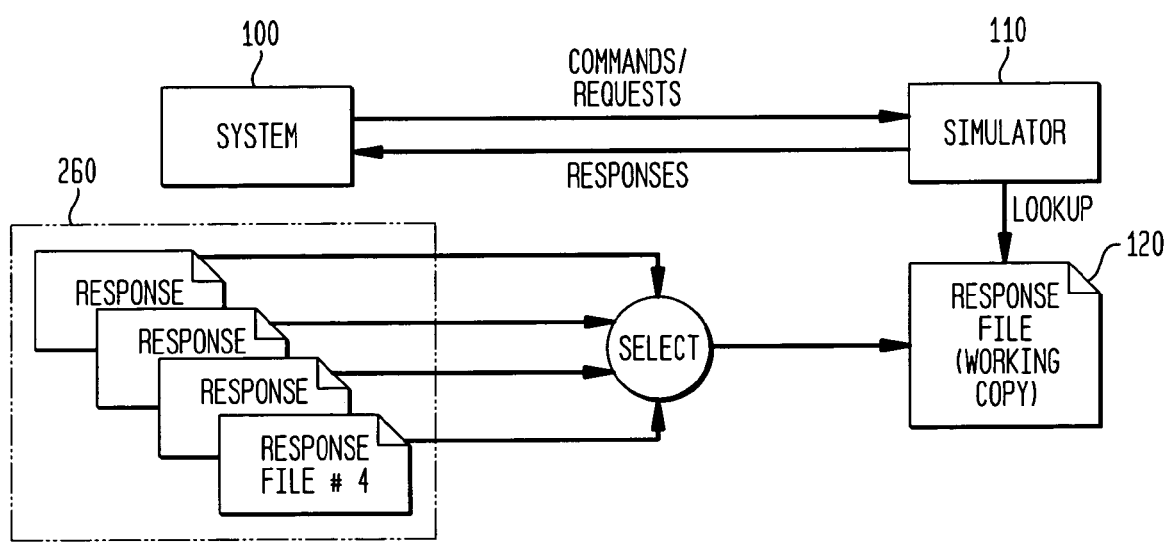
FIG. 5 is an exemplary aspect of the present application illustrating the use of multiple response files.

FIG. 5 illustrates the details of operation of the simulator 110, used in conjunction with the system 100. Various examples of this simulator 110 will be shown in conjunction with a simulator 110 which is separate from, but operatively connected to, the system 100. However, it should be understood by those of ordinary skill in the art that such examples are equally applicable to a simulator 110 which is located within the system 100, and to a simulator 110 located within an article of manufacture 300 as shown in FIG. 4b.

As previously stated, the system 100 is connected to the simulator 110 and sends commands/requests thereto and receives responses therefrom. The simulator 110 elicits the appropriate responses from a selected response file 120. This response 120 can be selected from various response files stored in a database 260, based upon a received message. Alternatively, when the simulator 110 is configured, it can then select from a plurality of prestored response files.

FIG. 5 illustrates a "select" function, which allows a user to select one of a plurality of response files stored in a database 260. Using a Microsoft Windows implementation, for example, such a feature may be provided using a "file open" dialog box. By selecting and using different response files 120, the simulator 110 can act as different systems with different behaviors, without ever having to change simulators.

A message is received by simulator 110 from the system 100, and then the message is compared to information stored in a response file 120 used to simulate system response. The response file 120 includes at least one message, a message marker associated with each message, and at least one response associated with each message, an end-of-response marker associated with each response. Once the appropriate response file 120 is selected, a response to the system message is simulated by outputting the response stored in association with the stored message matching the received message, upon the received message matching a message stored the response file. When at least two responses are stored in association with the same message, the at least two responses are sequentially output in response to sequential receipt of the same message.

Figure 6:
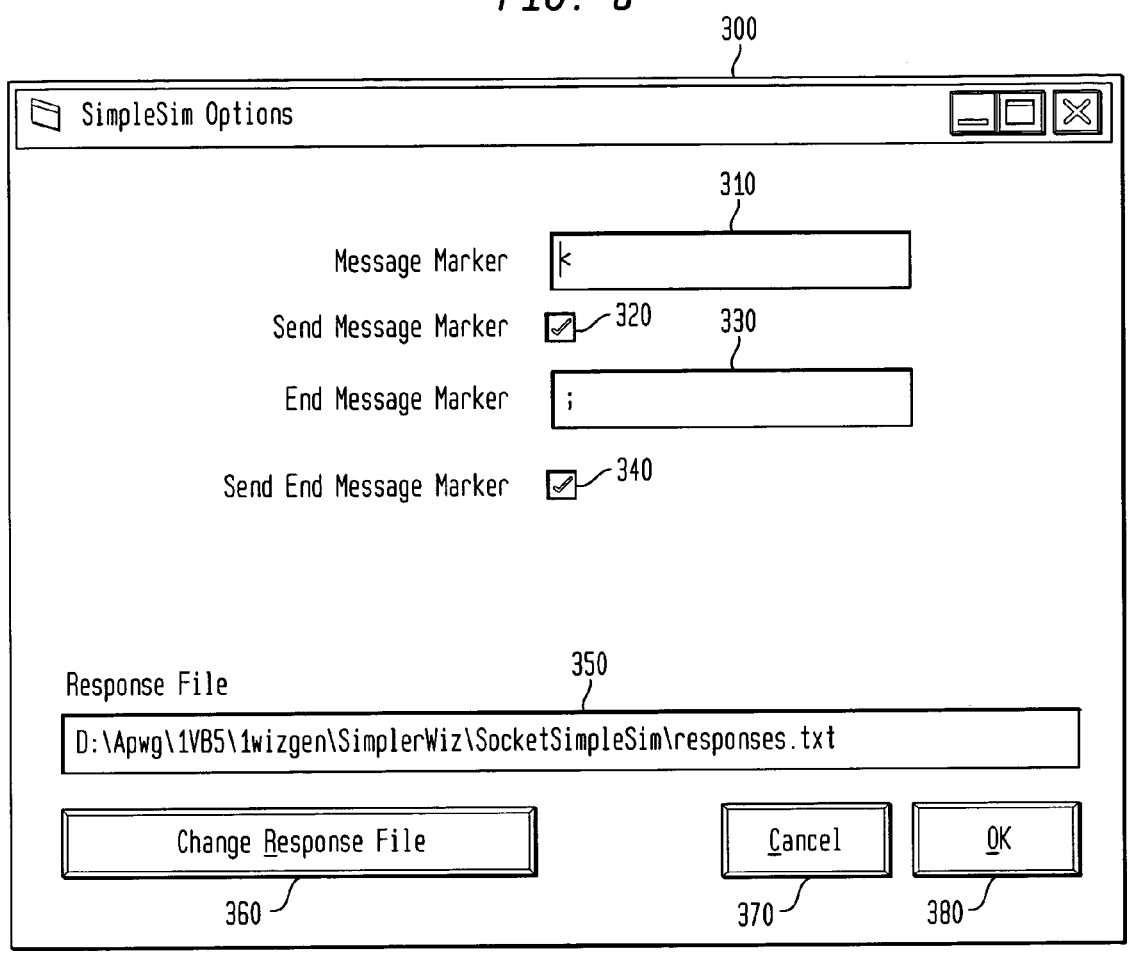
FIG. 6 is an options screen for setting parameters of a simulator of one embodiment of the present application.

FIG. 6 is a screen shot of an example of an "options screen" 300 for setting parameters of simulator 110 of the present application. In other words, before beginning the actual simulation wherein responses will be sent in response to received messages, simulator parameters and designations are first set to thereby customize or create an appropriate simulator 110. These include the designation of various characters, similar to those stored in a response file 120 and used to identify messages which will be stored in association with the appropriate responses. The first is the designation of the message marker 310, which in the example shown in FIG. 6 is a "<" ("less than" symbol). This character identifies a message stored in the response file 120. Then, a box 320 is provided for setting the selected message marker 310 to the simulator 110 configuration; and if selected, the message becomes the marker used in identifying the messages in the response file 120.

Another parameter designation shown in FIG. 6 is the setting of an end of message marker 330 which will be used by the simulator 110 to define the end of a message stored in the response file 120 and to denote the end of a message received from system 100. In the example shown in FIG. 6, the end message marker 330 is designated as a ";" ("semi-colon"). A box 340 is also provided for setting the selected message marker 330 to the simulator 110 configuration; and if selected, the end of message marker becomes the marker used in identifying the end of messages. Although not shown in FIG. 6, an end-of-response marker is also preferably designated for simulator 110, in a manner similar to the message marker and end-of-message marker, but is not shown nor further explained for the sake of brevity.

The simple simulator "options screen" 300 as shown in FIG. 6 further includes a window 350 for setting the response file name, thereby linking or associating the created simulator 110 with a stored response file 120 (wherein the named response file is created using message markers, end of message markers, and end-of-response markers consistent with those designated for use by the simulator 110). In the example shown in FIG. 6, the response file 120 is identified as "D:\Apwg\1VB5\1wizgen\SimplerWiz\SocketSimpleSim\responses.txt". As such, the message marker, end message marker and end-of-response marker (not shown) designated in FIG. 6 are also used in the response file 120 identified in FIG. 6. This "options screen" 300 of FIG. 6 also provides a button 360 to change the response file 120 (or select a different response file) associated with the created simulator 110, a button 370 to cancel previous input, and an "okay" button 380 used to set the various parameters or designations of the simulator 110 as entered in the "options screen" 300 of FIG. 6.

The end of message marker 330, identified as the ";" ("semi-colon") in FIG. 6, can be used to designate both the end of a message and the end of a response. Alternatively, a separate end-of-response marker can be designated, and associated with each response stored in the response file.

An example response file (for illustrative purposes) is shown in Table 1 below:

TABLE 1 responses.txt

<m1;
    This is the only response to m1.
;
<m2;
    This is the 1st response to m2.
;
<m2;
    This is the 2nd response to m2.
;
<m2;
    This is the 3rd response to m2.
    This has more than one line.
;
Timer 25000
    This is an Autonomous message sent after 25,000 milliseconds
(i.e., 25 seconds)
;
Timer 10000 R
    This is an Autonomous message that is sent every 10,000
milliseconds (i.e., every 10 seconds)
;

In Table 1 entitled "responses.txt", the "<" symbol is the message marker used to identify each message. Thus, when a message is received, the received message is compared by simulator 110 to information stored in the response file 120 used to simulate system response. Accordingly, in the example shown in Table 1, if a message "m1" is received, then it is compared to response file 120. Message markers in the response file 120 are first identified by simulator 110 (wherein the simulator 110 has been previously established or configured so as to recognize a message based upon a designated message marker) to indicate the location of a message, and then the particular message received is compared to the various messages identified by the message marker. In this case, if the message "m1" is received, it is compared and matched with the item "<m1" as shown in Table 1 above. The end of the message is also identified in the response file 120 by a ";", as shown in Table 1. Thus, the response file "responses.txt" shown above includes at least one message "m1", a message marker associated with each message "<" and further includes at least one response associated with each message in an end-of-response marker associated with each response as will be explained as follows.

Referring again to the example of Table 1, once the received message information is compared by simulator 110 to information stored in the response file 120 used to simulate system response, and a match is found, then the simulator 110 looks in response file 120 for the response associated with the message. In the example above, assuming that the message is "m1", then the response "this is the only response to m1." is identified as being the first response associated with the message "m1". The end of the response is identified by simulator 110 by an end-of-response marker associated with the response, which is a ";" in Table 1. Once the response and the end of the response are identified, a response to the received system message is simulated by simulator 110 outputting the response stored in association with the message matching the received message. Thus, the response "this is the only response to m1." is output by simulator 110 back to system 100.

In some instances, a plurality of responses is stored in a response file 120, in association with a single message. In Table 1, this occurs with the message "m2". The first time the message "m2" is received, simulator 110 compares it and the first response associated therewith is found and output. Thus, the first time message "m2" is received, the response "this is the $1^{st}$ response to m2." is output to the system 100.

The simulator 110 of the present application keeps track of the fact that the message "m2" has been received one time. Thereafter, when the message "m2" is received a second time, since at least two responses are stored in association with the message "m2", the at least two responses will be sequentially output in response to sequential receipt of the message. Thus, when the message is received the second time, the second response associated with the message "m2" is output by simulator 110 to the system 100, namely the response "this is the $2^{nd}$ response to m2." is output. Thereafter, if more responses are stored in association with the message, such as the third response stored in association with the message "m2" in Table 1 above, then a next response is again sequentially output. In this case, if the message "m2" is received a third time, the message "this is the $3^{rd}$ response to m2. This has more than one line." is output by simulator 110 to the system 100. Thereafter, if no more responses are stored, and the message "m2" is received again, the simulator 110 cycles back and the first response, namely "this is the $1^{st}$ response to m2." is again output.

Finally, the example response file of Table 1 also includes two autonomous messages, which are output by simulator 110 a predetermined time after simulation begins, irrespective of a received message. The first autonomous message occurs after 25,000 milliseconds, and the second occurs every 10,000 milliseconds. Thus, the first is an autonomous message is output by simulator 110 one time, namely 25,000 milliseconds after simulation begins, and the second is a recurring autonomous message, output by simulator 110 every 10,000 milliseconds and is thus periodically output irrespective of a received message.

Figure 7:
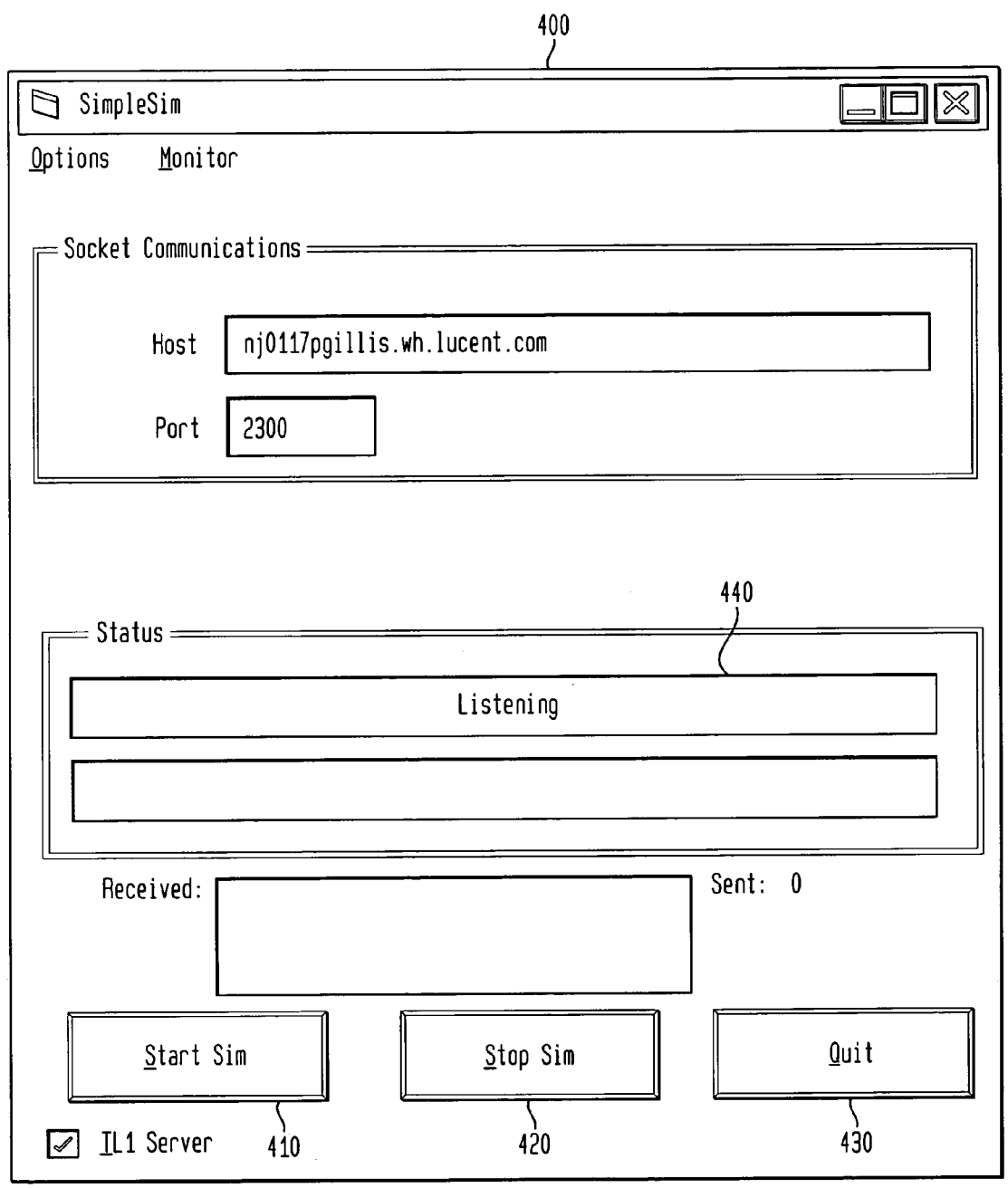
FIG. 7 is an exemplary screen shot of the simple simulator of the present application in operation.

FIG. 7 is a screen shot 400 of the simple simulator of the present application in operation. As can be seen from the screen shot shown in FIG. 7, the simulator 110 can be developed such that the socket communications, namely the computer hosting the simulator and the port of connection between the simulator 110 and the system 100, are identified in the screen shot. The configuration of the simulator 110 includes buttons enabling the starting of a simulation (start sim 410); the stopping of a simulation (stop sim 420); and quitting the simulation operation (quit 430). Preferably, the status of the simulation is displayed in window 440 as well as the information received and sent. In the example shown in FIG. 7, the simulation has been started, but no messages have been sent and no responses have been received. At this point, the simulator 110 is merely listening for messages from system 100. At this time, no such messages have been received. Again, the depiction shown in FIG. 7 is merely an exemplary simulator 110, for example, and should not be considered limiting of the present application. Many aspects of the simulator 110 can optionally be displayed or not displayed as desired by the user.

Finally, FIG. 8 is an example of a monitor 500 displaying messages sent to and received from the simulator 110. In this example, system 100 sends a first message "m1" to the simulator 110. In response thereto, the simulator 110 outputs the sole response stored in the response file 120 in association with message m1, namely the response "this is the only response to m1." Thereafter, the message "m1" is again sent to the simulator 110 and since only one response has been stored in the response file 120 of the simulator 110 in association with message m1, the same response is again received by the system 100, namely the response "this is the only response to m1."Thereafter, the message "m2" is sent, wherein the response file 120 has previously stored two responses for the message "m2". Thus, the first time the message "m2" is received, the response "this is the $1^{st}$ response to m2." is received by the system 100. Since the simulator 110 stores the fact that m2 had been received once before, the next time the message "m2" is received, the second response is output, namely the response "this is the $2^{nd}$ response to m2." Similarly, when the message "m2" is received again, since a third response has been stored in association with the message "m2", the response "this is the $3^{rd}$ response to m2. This has more than one line." is received as shown in FIG. 8. Finally, since only three responses are stored in association with message m2 in the response file 120 of the simulator 110, when message "m2" is again received a fourth time, the system cycles through the responses and again outputs the first response, namely the response "this is the $1^{st}$ response to m2."

As further illustrated in FIG. 8, the response file 120 not only stores messages m1 and m2 and their associated responses, but also includes two types of autonomous messages. The first autonomous message is one, which is periodically outputted by simulator 110 irrespective of a received message. Namely, it is output every 10,000 milliseconds or every 10 seconds. Thus, 10 seconds after simulation begins, the system 100 receives a message "this is an autonomous message that is sent every 10,000 milliseconds (i.e., every 10 seconds)." Thereafter, if the simulation is still on going after another 10 seconds has past, the system 100 receives a second periodic autonomous message, again indicating "this is an autonomous message that is sent every 10,000 milliseconds (i.e., every 10 seconds)."

Finally, the response file 120 of the simulator 110 used in association with the system 100 shown in FIG. 8 also stores the second autonomous message. This autonomous message is output a predetermined time after simulation begins, irrespective of a received message. The message received in FIG. 8 is one sent out 25 seconds after simulation begins. Thus, after 10 seconds the first autonomous message is received, after another 10 seconds the first autonomous message is received again, and after 25 seconds has elapsed, the last "one time" autonomous message, "this is an autonomous message sent after 25,000 milliseconds (i.e., 25 seconds)." is received.

As such, the generic simulator and simulation process of the present application allows for the creation of an appropriate simulator 110 in a smooth and efficient manner. The generic simulator of the present application can reply to any message by looking up its associated response in a response file 120 including message/response pairs. A message appears on one line in a response file 120, followed by its response (which may span multiple lines), terminated by a designated end-of-response marker. When the simulator 110 receives a message, it looks up the message in the response file 120 and outputs its associated response. If more than one response is associated with a message in the response file 120, successive identical messages illicit successively stored responses. In addition, autonomous responses can be stored and output periodically, or after lapses of a predetermined time period, to thereby enable the system 100 to effectively simulate operation of an overall system component which must be able to interact with the system 100 under development. Accordingly, the system 100 under development can thereby be efficiently and accurately created, through the use of the simulator 110 and simulation process of the present application, even if the system being simulated has not yet been developed and/or even if it must be tested for its interactiveness with several other systems.

The invention being thus described, it will be obvious that the same may be varied in many ways. Such variations are not to be regarded as a departure from the spirit and scope of the invention, and also its modifications as would be obvious to one of ordinary skill in the art are intended to be included within the scope of the following claims.

What is claimed is:

1. A simulation process, comprising:
   receiving a message from a system;
   comparing the received message to information stored in a response file used to simulate system response, the response file including at least one message, a message marker associated with each message, at least one response associated with each message, and an end-of-response marker associated with each response; and
   simulating a response to the system message by outputting a response stored in association with a stored message matching the received message, upon the received message matching a message stored in the response file, wherein upon at least two responses being stored in association with a message, the at least two responses are sequentially output in response to sequential receipt of the message.

2. The simulation process of claim 1, wherein the simulation process occurs within the system.

3. The simulation process of claim 1, wherein the simulation process occurs within a device separate from, but operatively connected to the system.

4. The simulation process of claim 1, wherein the response file includes at least one autonomous response, wherein the autonomous response is output a predetermined time after simulation begins, irrespective of a received message.

5. The simulation process of claim 1, wherein the response file includes at least one autonomous response, wherein the autonomous response is periodically output irrespective of a received message.

6. The simulation process of claim 1, wherein the response file includes at least two different messages, each associated with at least one response.

7. The simulation process of claim 1, further comprising:
   storing a record of a received message, wherein upon a message being received a second time, either a second response stored in association with the received message is output, or the first response is again output if no second response is stored in association with the received message.

8. The simulation process of claim 7, wherein sequential responses stored in the response file in association with a common message are sequentially output upon successive receipt of the common message.

9. The simulation process of claim 1, wherein sequential responses stored in the response file in association with a common message are sequentially output upon successive receipt of the common message.

10. The simulation process of claim 1, wherein the response file is created using a log file of the system.

11. A simulator, comprising:
    a memory, adapted to store a response file, the response file being used to simulate system response and including at least one message, a message marker associated with each message, at least one response associated with each message, and an end-of-response marker associated with each response;
    a comparator, adapted to compare a message received from a system to information stored in the response file to determine whether or not the received message matches a message stored in the response file; and
    an output device adapted to simulate a response to the system message, upon determining that a received message matches a message stored in the response file, by outputting a response stored in association with the matching stored message,
    wherein upon at least two responses being stored in association with a message, the at least two responses are sequentially output in response to sequential receipt of the message.

12. The simulator of claim 11, wherein the simulator is located within the system.

13. The simulator of claim 11, wherein the simulator is separate from but operatively connected to the system.

14. The simulator of claim 11, wherein the response file, stored in the memory, includes at least one autonomous response, wherein the autonomous response is output a predetermined time after simulation begins, irrespective of a received message.

15. The simulator of claim 11, wherein the response file, stored in the memory, includes at least one autonomous response which is periodically output, irrespective of a received message.

16. The simulator of claim 11, wherein the response file, stored in the memory, includes at least two different messages, each associated with at least one response.

17. The simulator of claim 11, wherein the memory further stores a record of a received message, wherein upon a message being received a second time, either a second response stored in association with the received message is output, or the first response is again output if no second response is stored in association with the received message.

18. The simulator of claim 17, wherein sequential responses stored in the response file in association with a common message are sequentially output upon successive receipt of the common message, to simulate a response.

19. The simulator of claim 11, wherein sequential responses stored in the response file in association with a common message are sequentially output upon successive receipt of the common message, to simulate a response.

20. The simulator of claim 11, wherein the response file is created using a log file of the system.

21. An article of manufacture for use in conjunction with a computer, comprising:
a first computer readable code segment for causing a computer to compare a message received from a system to information stored in a response file used to simulate system response, the response file including at least one message, a message marker associated with each message, at least one response associated with each message, and an end-of-response marker associated with each response; and
a second computer readable code segment for causing a computer to simulate a response to the system message by outputting a response stored in association with a stored message matching the received message, upon the received message matching a message stored in the response file, wherein upon at least two responses being stored in association with a message, the at least two responses are sequentially output in response to sequential receipt of the message.

22. The article of manufacture of claim 21, wherein the article of manufacture is for use in conjunction with a computer of the system.

23. The article of manufacture of claim 21, wherein the article of manufacture is for use in conjunction with a computer separate from, but operatively connected to the system.

24. The article of manufacture of claim 21, wherein the response file includes at least one autonomous response, wherein the second computer readable code segment causes the computer to output the autonomous response a predetermined time after simulation begins, irrespective of a received message.

25. The article of manufacture of claim 21, wherein the response file includes at least one autonomous response, wherein the second computer readable code segment causes the computer to output the autonomous response periodically, irrespective of the received message.

26. The article of manufacture of claim 21, wherein the response file includes at least two different messages, each associated with at least one response.

27. The article of manufacture of claim 21, further comprising:
a third computer readable code segment for causing the computer to store a record of a received message, wherein upon a message being received a second time, either a second response stored in association with the received message is output, or the first response is again output if no second response is stored in association with the received message.

28. The article of manufacture of claim 27 wherein sequential responses stored in the response file in association with a common message are sequentially output upon successive receipt of the common message.

29. The article of manufacture of claim 21 wherein sequential responses stored in the response file in association with a common message are sequentially output upon successive receipt of the common message.

30. The article of manufacture of claim 21 wherein the response file is created using a log file of the system.

* * * * *